(12) United States Patent
Moser et al.

(10) Patent No.: US 10,578,974 B2
(45) Date of Patent: Mar. 3, 2020

(54) OPTICAL ELEMENT, IN PARTICULAR FOR A MICROLITHOGRAPHIC PROJECTION EXPOSURE APPARATUS

(71) Applicant: Carl Zeiss SMT GmbH, Oberkochen (DE)

(72) Inventors: Ralf Moser, Oberkochen (DE); Florian Herold, Aalen (DE); Arno Schmittner, Koenigsbronn (DE); Holger Kierey, Aalen (DE); Wolfgang Merkel, Neu-Ulm (DE); Georgo Metalidis, Koenigsbronn-Zang (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/447,001

(22) Filed: Jun. 20, 2019

(65) Prior Publication Data

US 2019/0302624 A1     Oct. 3, 2019

Related U.S. Application Data

(63) Continuation of application No. PCT/EP2017/079562, filed on Nov. 17, 2017.

(30) Foreign Application Priority Data

Dec. 23, 2016   (DE) .................. 10 2016 226 202

(51) Int. Cl.
*G03F 7/20* (2006.01)
*G21K 1/06* (2006.01)
*G02B 5/08* (2006.01)

(52) U.S. Cl.
CPC ......... *G03F 7/7015* (2013.01); *G02B 5/0891* (2013.01); *G03F 7/70316* (2013.01);
(Continued)

(58) Field of Classification Search
CPC . G93F 7/70925; G03F 7/70975; G03F 7/7015
(Continued)

(56) References Cited

U.S. PATENT DOCUMENTS 8,723,147 B2 *  5/2014  Abhari ............... G03F 7/70908
                                                    250/503.1
2012/0025109 A1  2/2012  Abhari et al.
(Continued)

FOREIGN PATENT DOCUMENTS

DE     10 2011 077 983 A1    12/2012
DE     10 2013 102 670 A1    10/2014
(Continued)

OTHER PUBLICATIONS

The International Search Report and Written Opinion from the counterpart PCT Application No. PCT/EP2017/079562, dated Feb. 16, 2018.
(Continued)

*Primary Examiner* — Hung Nguyen
(74) *Attorney, Agent, or Firm* — Fish & Richardson P.C.

(57) ABSTRACT

The disclosure relates to an optical element, in particular for a microlithographic projection exposure apparatus. The optical element has an optical effective surface. The optical element includes a substrate, a layer system that is present on the substrate, and a protective cover extending over an edge region of the optical element that is adjacent to the optical effective surface. During operation of the optical element, the protective coating reduces an ingress of hydrogen radicals into the layer system in comparison with an analogous design without the protective cover, wherein a gap is formed between the protective cover and the layer system.

20 Claims, 9 Drawing Sheets

(52) U.S. Cl.
CPC ...... *G03F 7/70958* (2013.01); *G03F 7/70983* (2013.01); *G21K 1/062* (2013.01); *G21K 1/065* (2013.01)

(58) Field of Classification Search
USPC ...................................... 355/53, 67
See application file for complete search history.

(56) References Cited

U.S. PATENT DOCUMENTS

| | | |
|---|---|---|
| 2014/0193591 A1 | 7/2014 | Kuznetzov et al. |
| 2016/0187543 A1 | 6/2016 | Bekman et al. |
| 2017/0160639 A1 | 6/2017 | Ehm et al. |

FOREIGN PATENT DOCUMENTS

| | | |
|---|---|---|
| DE | 10 2015 215 014 A1 | 10/2015 |
| DE | 10 2014 222 534 A1 | 11/2015 |
| DE | 10 2014 216 240 A1 | 2/2016 |
| DE | 10 2016 213 839 A1 | 12/2016 |
| EP | 2 905 637 A1 | 8/2015 |
| WO | WO 2011/131431 A1 | 10/2011 |
| WO | WO 2012/136420 A1 | 10/2012 |
| WO | WO 2016/058822 A1 | 4/2016 |

OTHER PUBLICATIONS

GPTO-Office Action, with translation thereof, for corresponding DE Appl No. 10 2016 226 202.5, dated Jul. 27, 2017.
IPRP for corresponding PCT Appl. No. PCT/EP2017/079562, dated Jul. 4, 2019.

\* cited by examiner

Prior art

OPTICAL ELEMENT, IN PARTICULAR FOR A MICROLITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2017/079562, filed Nov. 17, 2017, which claims benefit under 35 USC 119 of German Application No. 10 2016 226 202.5 filed on Dec. 23, 2016. The entire disclosure of these applications are incorporated by reference herein.

FIELD

The disclosure relates to an optical element, in particular for a microlithographic projection exposure apparatus.

BACKGROUND

Microlithography is used for producing microstructured components such as, for example, integrated circuits or LCDs. The microlithography process is carried out in what is called a projection exposure apparatus, which includes an illumination device and a projection lens. The image of a mask (=reticle) illuminated by way of the illumination device is in this case projected by way of the projection lens onto a substrate (e.g. a silicon wafer) coated with a light-sensitive layer (photoresist) and arranged in the image plane of the projection lens, in order to transfer the mask structure to the light-sensitive coating of the substrate.

In projection lenses designed for the EUV range, e.g. at wavelengths of e.g. approximately 13 nm or approximately 7 nm, owing to the lack of availability of suitable light-transmissive refractive materials, mirrors are used as optical components for the imaging process.

The EUV light is produced via an EUV light source which is based on a plasma excitation. This EUV light source includes a $CO_2$ laser for producing infrared radiation, the infrared radiation being focussed by way of a focusing optical unit and—as depicted merely schematically in FIG. 6—passing through an opening 601 present in a collector mirror 600 that is embodied as an ellipsoid, and being guided to a target material (e.g. tin droplet) that is produced via a target source and supplied to a plasma ignition position. The infrared radiation heats the target material situated in the plasma ignition position in such a way that the target material transitions into a plasma state and emits EUV radiation (with the plasma being denoted by "602" in FIG. 6). This EUV radiation is focussed onto an intermediate focus by way of the collector mirror 600 and enters a downstream illumination device via this intermediate focus.

Figure 6:
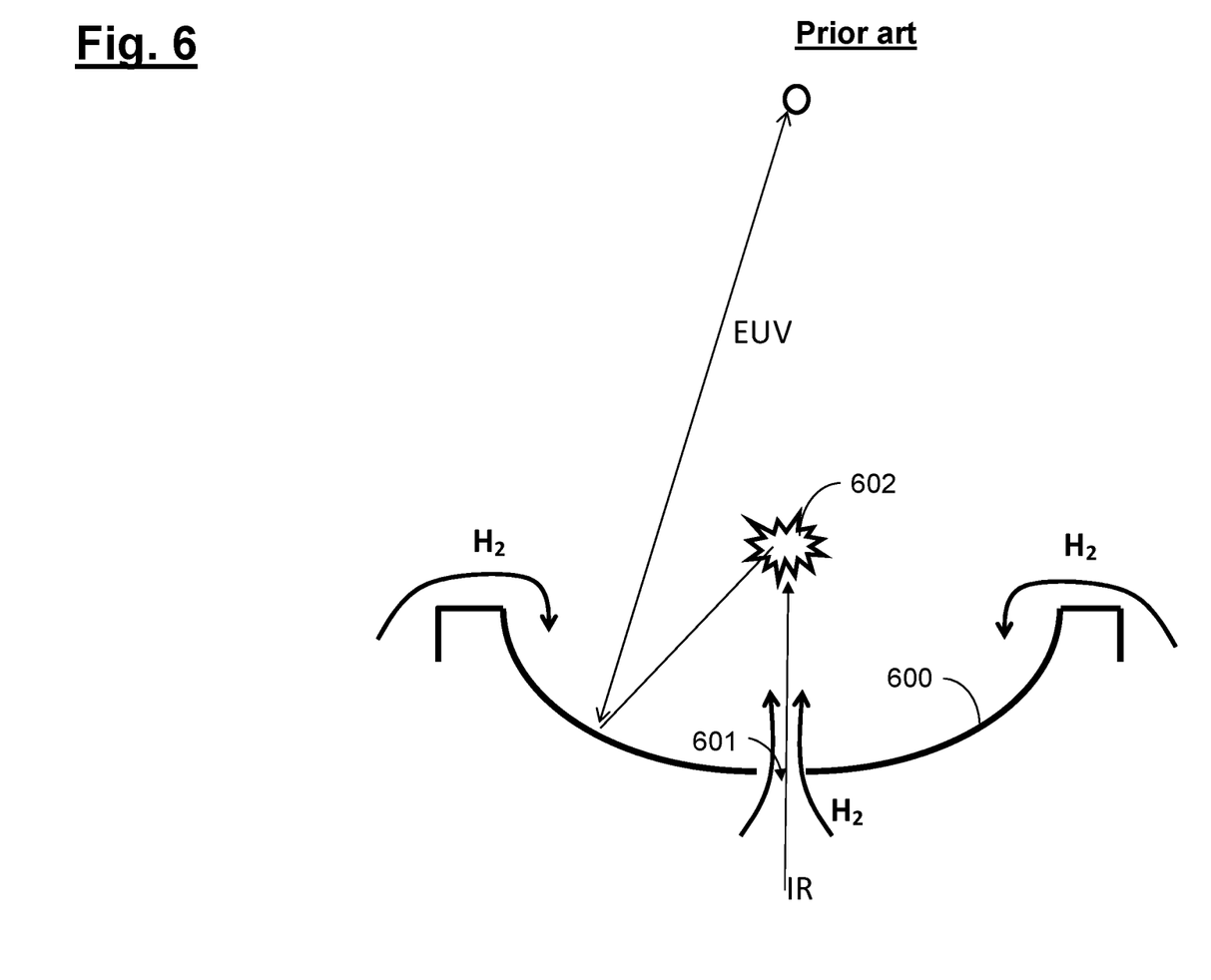
FIG. 6 shows a schematic illustration for elucidating the design of a conventional EUV light source.

In order to avoid contamination of the optical effective surface of the collector mirror 600 with target material (tin in this example), the practice of guiding hydrogen gas (as indicated in FIG. 6) over the collector surface is known. Here, the EUV radiation decomposes the hydrogen molecules into hydrogen radicals which, in turn, chemically combine with the tin, whereupon the arising Sn—H compound can be pumped away. Moreover, as indicated in FIG. 6, hydrogen gas can also be guided directly in the direction of the plasma 602 in order to keep tin (Sn) ions away from the collector surface in the first place.

In order to avoid a loss of reflectivity of the reflective optical components by contaminants entering into the respective optical system, the immediate surroundings of the relevant reflective optical components are charged with an atmosphere made of hydrogen (as a "purge gas") in other regions of the projection exposure apparatus as well, the atmosphere of hydrogen being intended to prevent the ingress of unwanted contaminants in the immediate surroundings of these reflective optical components.

It can arise in practice in all of the above-described cases that hydrogen radicals enter into the layer system that is present on the substrate of the respective reflective optical component, reach as far as the substrate surface, recombine there to form hydrogen molecules and, by way of a bubble formation (so-called "blister formation") that accompanies the accumulation of gas phases, lead to a layer detachment and, as a consequence, to a loss of reflectivity or the destruction of the reflective optical element.

Figure 7:
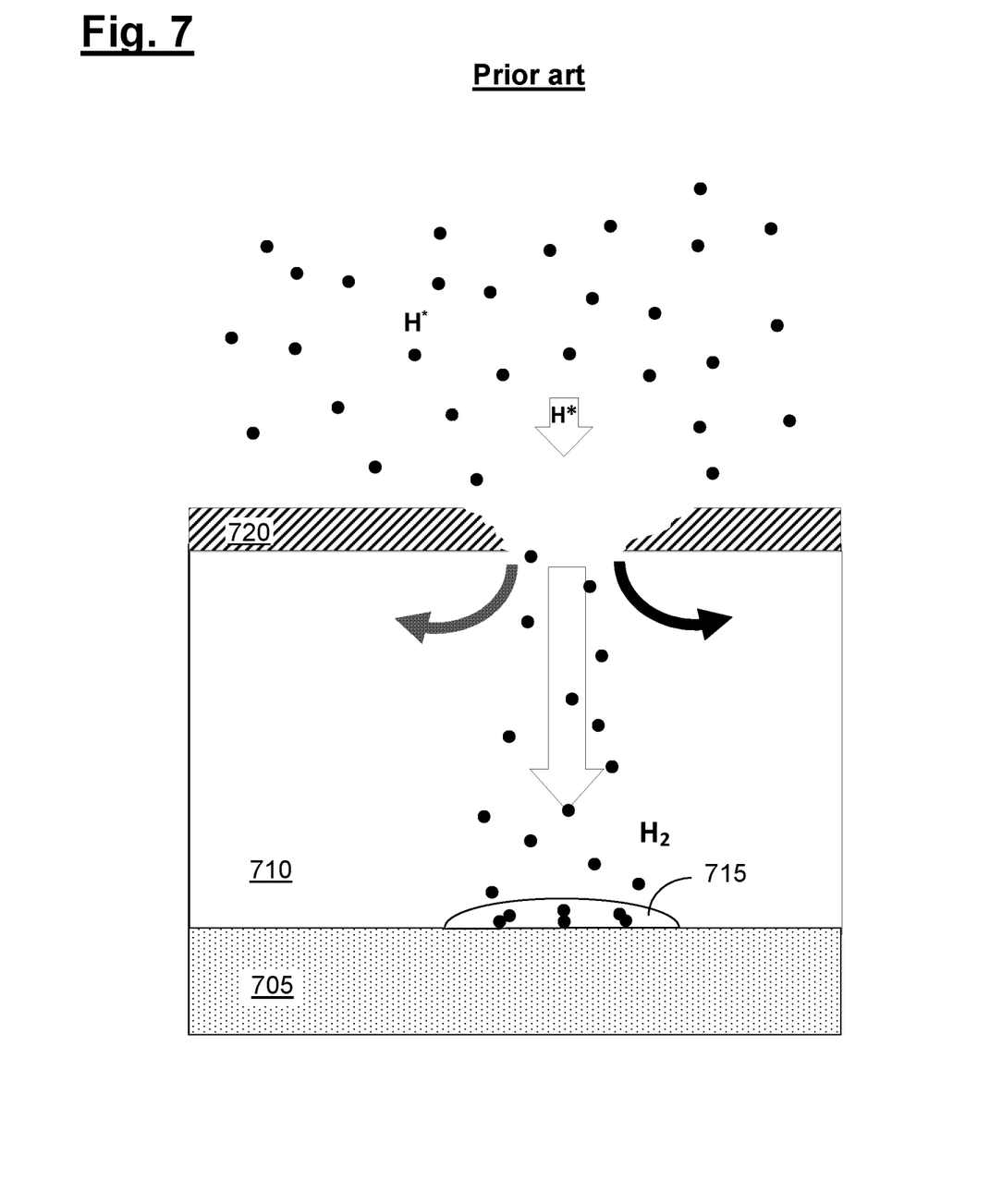
FIGS. 7, 8A and 8B show schematic illustrations for elucidating the problems underlying the disclosure.

Such a scenario is indicated purely schematically in FIG. 7, where "705" in this case denotes a mirror substrate, on which a layer system made of an intermediate layer 710 and a reflection layer system 720 (which in the example includes a multiple layer system made of an alternating succession of molybdenum (Mo) and silicon (Si) layers) are provided. As indicated in FIG. 7, the risk of ingress of the hydrogen radicals is increased in regions in which the reflection layer system 720 is interrupted by scratches, holes or pores, since the barrier effect that is still provided by the multiple layer system is no longer present there.

Figure 8A:
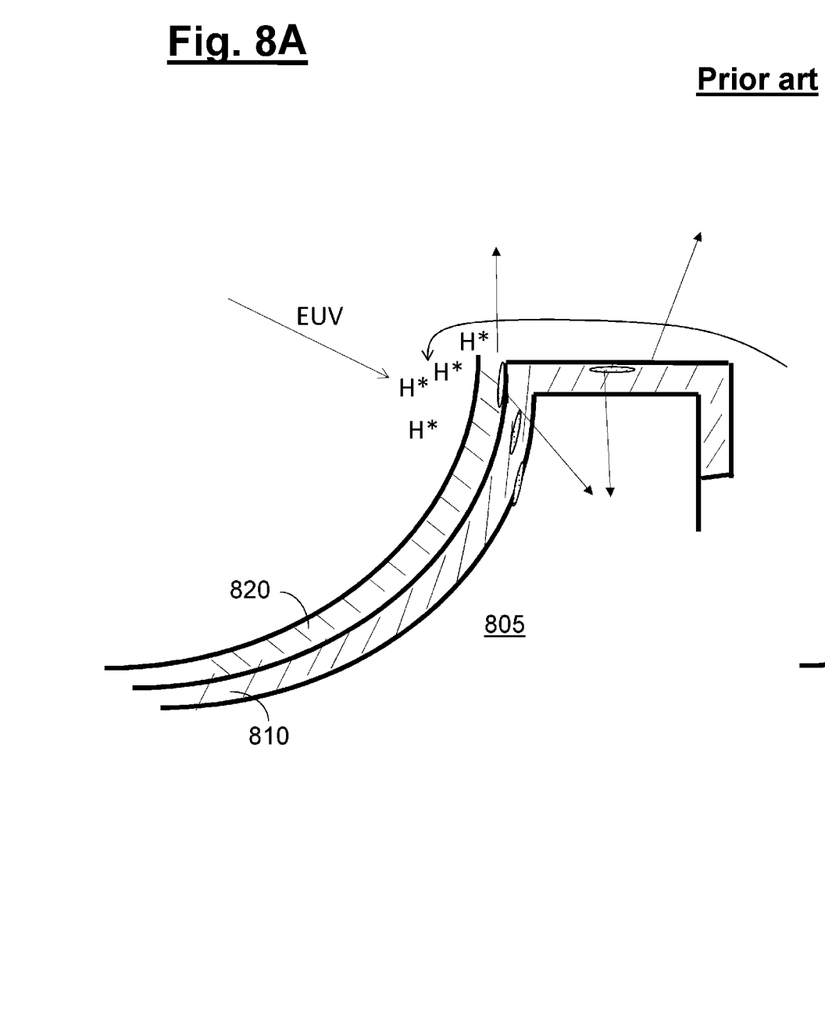
Figure 8B:
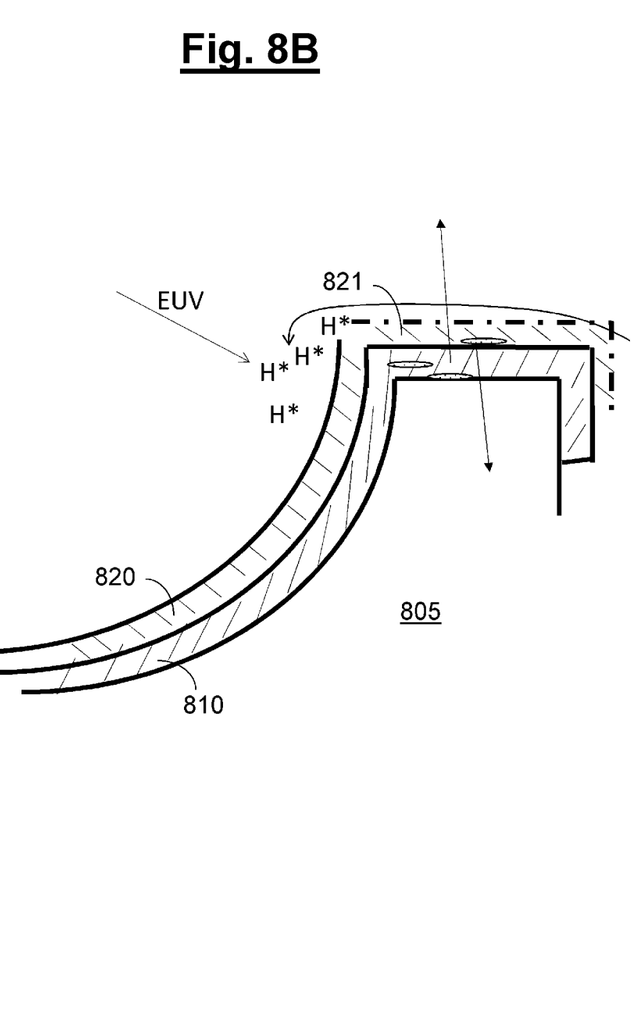

The issue described above may be particularly grave—as indicated in FIG. 8A and FIG. 8B—in edge regions of the respective optical element or mirror if, at the locations, either (according to FIG. 8A) the reflection layer system 820 that impedes the diffusion of the hydrogen atoms is exposed or no longer present in edge regions (FIG. 8A) or if the reflection layer system is damaged in an edge region 821 by scratches (FIG. 8B), as a consequence of which hydrogen radicals are able to enter and blister formation may occur.

Reference is made merely by way of example to DE 10 2014 216 240 A1, DE 10 2014 222 534 A1, DE 10 2013 102 670 A1, DE 10 2011 077 983 A1, WO 2012/136420 A1 and EP 2 905 637 A1.

SUMMARY

The present disclosure seeks to provide an optical element, in particular for a microlithographic projection exposure apparatus, in which an impairment of the reflection properties or destruction by hydrogen that is accumulated during operation of the optical element is avoided to the greatest possible extent.

According to one aspect, the disclosure relates to an optical element, in particular for a microlithographic projection exposure apparatus, wherein the optical element has an optical effective surface, including:
  a substrate;
  a layer system that is present on the substrate; and
  a protective cover which extends over an edge region of the optical element that is adjacent to the optical effective surface and which, during operation of the optical element, reduces an ingress of hydrogen radicals into the layer system in comparison with an analogous design without the protective cover;
  wherein a gap is formed between the protective cover and the layer system.

The disclosure in particular involves the concept of providing a protective cover in a gap distance to the layer system, such that the protective cover assists a recombination of hydrogen radicals to molecular hydrogen at the surface of the protective cover. As a consequence, in an edge region of the optical element the ingress of hydrogen radicals into the layer system of optical element can be avoided at least to a significant extent.

According to an embodiment, the gap has a mean gap thickness and a gap length, wherein the ratio between mean gap thickness and gap length is less than 0.8, in particular less than 0.5, further particularly less than 0.3, further particularly less than 0.1, further particularly less than 0.05, and further particularly less than 0.01.

Here, the disclosure contains the concept of promoting the recombination of the hydrogen radicals in the edge region by the selection of a suitable geometry—namely by the design of a gap that is narrow and long at the same time.

According to an embodiment, the gap has a mean gap thickness smaller than 0.6 mm, in particular less than 0.3 mm, further particularly less than 0.1 mm, and further particularly less than 0.05 mm. The mean gap thickness can be in particular in the range from 0.1 mm to 0.6 mm.

According to an embodiment, the gap has a gap length of at least 4 mm, in particular at least 6 mm, further particularly at least 8 mm.

According to an embodiment, the gap has a seal in its radially interior portion that faces the optical effective surface.

According to an embodiment, this seal is embodied as a mesh or film stack, in particular made of metal.

According to an embodiment, the seal is embodied as a scratch-avoiding coating or as a scratch-avoiding inlay, in particular made of polyethylene (PE), an adhesive, polyimide (PI) or indium (In).

According to an embodiment, the protective cover includes a material that assists the recombination of hydrogen radicals to form molecular hydrogen.

According to a further aspect of the disclosure, an optical element, in particular for a microlithographic projection exposure apparatus, includes an optical effective surface, and:
  a substrate;
  a layer system that is present on the substrate; and
  a protective cover which extends over an edge region of the optical element that is adjacent to the optical effective surface and which, during operation of the optical element, reduces an ingress of hydrogen radicals into the layer system in comparison with an analogous design without the protective cover;
  wherein the protective cover includes a material that assists the recombination of hydrogen radicals to form molecular hydrogen.

Here, in particular, the present disclosure is based on the concept of, in an edge region of an optical element, avoiding the ingress of hydrogen radicals into the region between a substrate and a layer system provided thereon by virtue of increasing the probability for recombination of these hydrogen radicals even before they ingress. In turn, according to one aspect of the disclosure, this is effectuated by the provision of a reactive wall made of a suitable material which assists a recombination of the hydrogen radicals that are incident with a comparatively high energy.

Restricting the protective cover according to the disclosure that provides this reactive wall to the relevant edge region of the optical element ensures that, firstly, the desired purging effect by hydrogen radicals is furthermore obtained in the remaining region of the optical effective surface but, secondly, a reliable protection against the ingress of hydrogen and a blister formation accompanying this is ensured in the edge region that is particularly at risk of the ingress of the hydrogen radicals into the layer system of the optical element as explained at the outset.

According to an embodiment, on its surface facing the edge region, the protective cover includes a coating or an inlay made of the material that assists the recombination of hydrogen radicals to form molecular hydrogen. In particular, this material can be copper (Cu), silver (Ag), gold (Au), nickel (Ni), cobalt (Co), chromium (Cr) or vanadium (V). Incidentally, the protective cover according to the disclosure may be produced from e.g. aluminium (Al) (as a base material).

However, the disclosure is not restricted to the above-described configuration including a coating made of the material that assists the recombination of hydrogen radicals. In further embodiments, the material assisting the recombination of hydrogen radicals may also serve globally as a base material for the protective cover according to the disclosure, wherein a coating made of a material (e.g. aluminium) that does not assist the hydrogen recombination may then be provided on the ("top") side of the protective cover which faces away from the layer system in order, in this respect, to ensure that hydrogen radicals can continue to be guided over the surface up to the optical effective surface to be purged.

According to an embodiment, a gap is formed between the protective cover and the layer system.

According to an embodiment, at least in regions, the protective cover is in direct contact with the layer system. Here, the disclosure can make use, in particular, of the effect that, in the case of a suitable selection of the material (e.g. copper (Cu)) that assists the hydrogen recombination, the relevant portion of the protective cover that faces the layer system is sufficiently soft to avoid scratching of the layer system—for example, a reflection layer stack made of molybdenum and silicon layers that is sensitive in this respect—during the adjustment or transport. By contrast, in the case of e.g. a comparatively hard material such as aluminium, the risk of damage by scratches during transport or adjustment would be an obstacle to a direct contact between the protective cover and the layer system.

However, even in the configuration described above with the direct contact between the protective cover and layer system of the optical element, the recombination-promoting effect of the material used according to the disclosure at the same time comes to bear to the extent that, in the case where form errors or tolerances are present (which can lead to the formation of a gap or lifting in regions), a recombination to molecular oxygen can still be obtained for the hydrogen radicals that ingress into gap regions.

According to an embodiment, the working wavelength is less than 30 nm, wherein, in particular, it may lie in the range from 5 nm to 15 nm, further particularly in the range from 5 nm to 10 nm.

The aforementioned design of a gap that is as narrow as possible and as long as possible between the protective cover and layer system for the purposes of an improved recombination of hydrogen radicals in the edge region is also advantageous independently of the above-described configuration of the protective cover with a material that assists the recombination of hydrogen radicals to form molecular hydrogen.

According to an embodiment, the optical element is a mirror. Here, in particular (without however restricting the disclosure thereto), this may relate to a collector mirror of a plasma light source.

The disclosure further relates to an optical system of a microlithographic projection exposure apparatus, the optical system including at least an optical element having the features described above. In particular, the optical system can be a plasma light source.

The disclosure further also relates to a microlithographic projection exposure apparatus including an illumination device and a projection lens, wherein the illumination device, during the operation of the projection exposure apparatus, illuminates a mask situated in an object plane of the projection lens, and the projection lens images structures on the mask onto a light-sensitive layer situated in an image plane of the projection lens, wherein the projection exposure apparatus includes an optical element or an optical system having the features described above.

Further configurations of the disclosure can be gathered from the description and the dependent claims.

BRIEF DESCRIPTION OF THE DRAWINGS

The disclosure is explained in greater detail below on the basis of exemplary embodiments illustrated in the accompanying figures, in which.

DETAILED DESCRIPTION OF PREFERRED EMBODIMENTS

Figure 9:
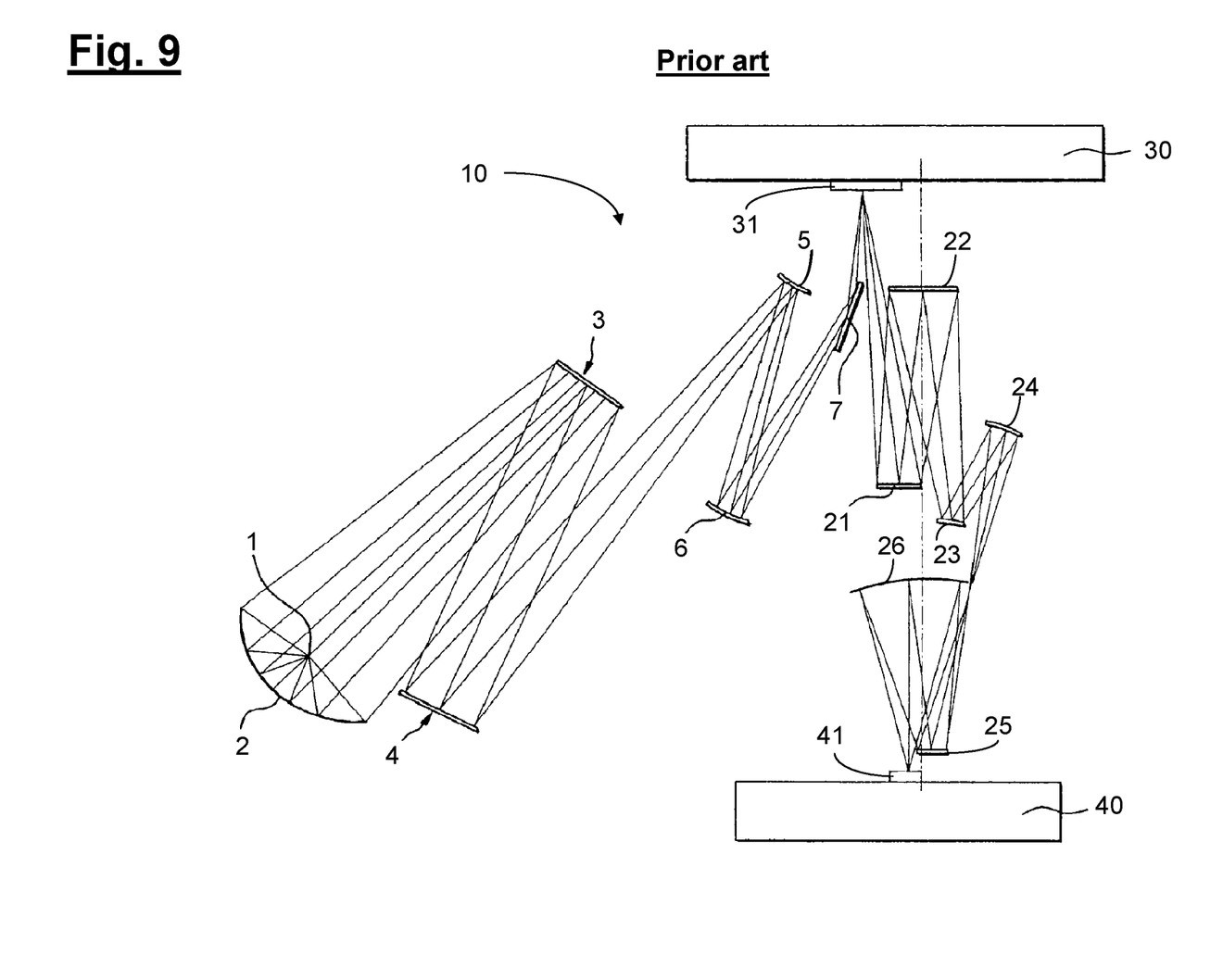
FIG. 9 shows a schematic illustration of a projection exposure apparatus designed for operation in the EUV.

FIG. 9 firstly shows a merely schematic illustration of a projection exposure apparatus 10 which is designed for operation in the EUV and in which the present disclosure can be realized in an exemplary manner.

According to FIG. 9, an illumination device of the projection exposure apparatus 10 includes a field facet mirror 3 and a pupil facet mirror 404. The light from a light source unit including a plasma light source 1 and a collector mirror 2 is directed onto the field facet mirror 4. A first telescope mirror 5 and a second telescope mirror 6 are arranged in the light path downstream of the pupil facet mirror 4. A deflection mirror 7 operated with grazing incidence is arranged downstream in the light path and directs the radiation impinging on it onto an object field in the object plane of a projection lens with mirrors 21-26, which is merely indicated in FIG. 9. At the location of the object field, a reflective structure-bearing mask 31 is arranged on a mask stage 30, the mask being imaged with the aid of a projection lens into an image plane in which a substrate 41 coated with a light-sensitive layer (photoresist) is situated on a wafer stage 40.

Below, possible embodiments of an optical element according to the disclosure are described with reference to the schematic illustrations of FIG. 1-5. Here, this may relate to e.g. a mirror of the projection exposure apparatus from FIG. 9 or else the collector mirror of the EUV light source that is described on the basis of FIG. 6.

Figure 1:
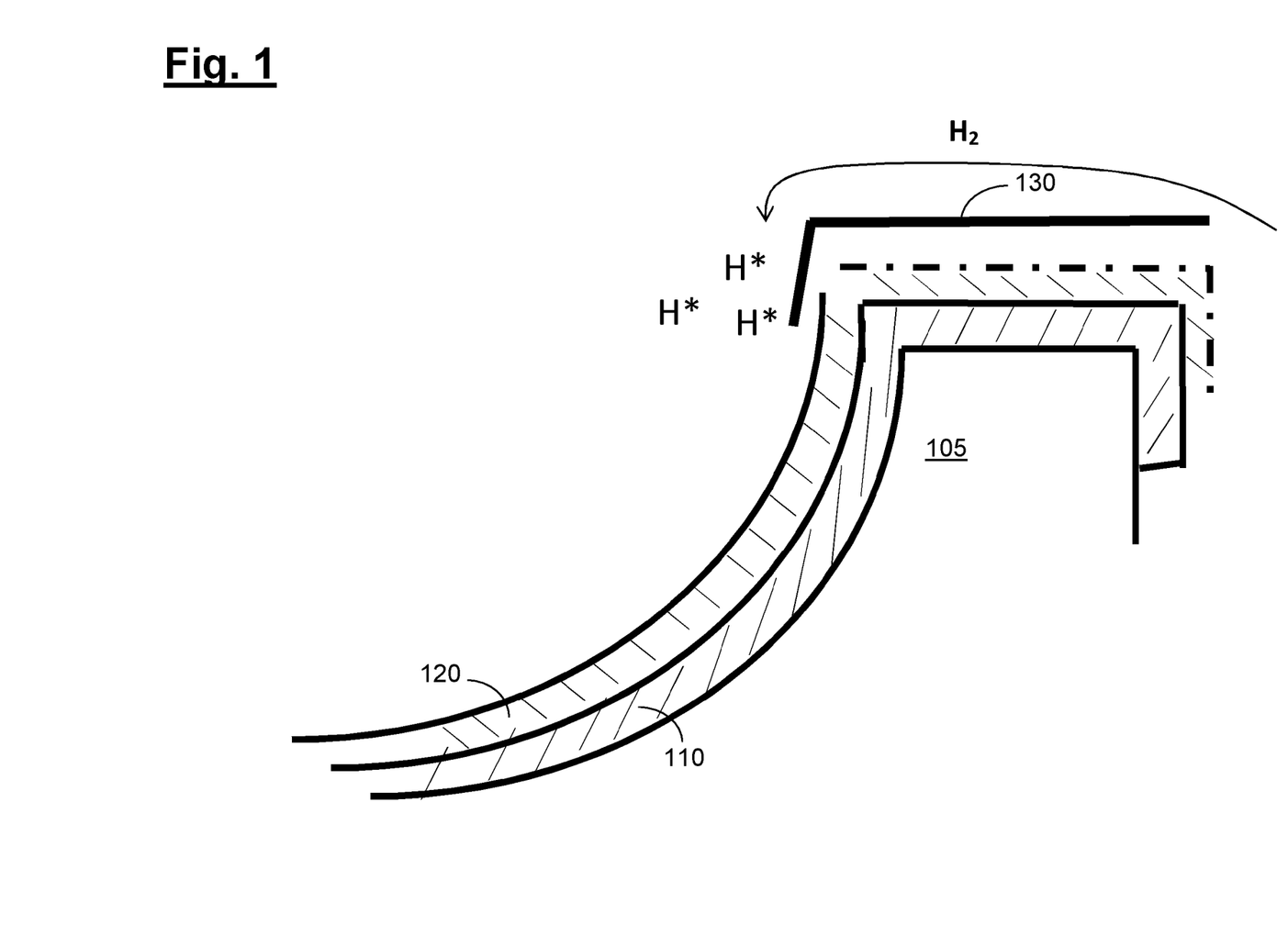
FIGS. 1-5 show schematic illustrations for elucidating the possible design of an optical element in exemplary embodiments of the disclosure.

In accordance with FIG. 1, an optical element according to the disclosure in the form of a collector mirror of an EUV plasma light source includes a substrate 105 and a layer system that is present on the latter, the layer system, in the exemplary embodiment, having a reflection layer stack 120 (having an alternating sequence of molybdenum (Mo) and silicon (Si) layers) and an arbitrary intermediate layer 110 that is arranged between the reflection layer stack 120 and the substrate 105 (or else a plurality of intermediate layers).

As indicated in FIG. 1, hydrogen gas is guided over the surface of the optical element for the purposes of avoiding contamination or for purging purposes, the hydrogen gas being decomposed into hydrogen radicals (denoted by "H*") under the influence of the electromagnetic (EUV) radiation that is present during the operation of the relevant optical system. In a manner known per se, the function of these hydrogen radicals is to form a chemical compound with contamination that is present on the surface of the collector mirror (e.g. tin contamination), whereupon the desired purging effect is obtained by pumping away the respective compound (a tin (Sn)-hydrogen (H) compound in the example).

According to FIG. 1, the optical element according to the disclosure includes a protective cover 130 which extends over an edge region of the optical element or collector mirror. In the exemplary embodiment, the protective cover 130 is produced from aluminium (Al). An elongate gap with a ratio between mean gap thickness and gap length of less than 0.1 is situated between the protective cover 130 and the layer system or the reflection layer stack 120. In embodiments, the mean gap thickness may lie in the range from 0.1 mm to 0.6 mm, whereas the gap length may be e.g. at least 6 mm.

The recombination of hydrogen radicals is particularly promoted if these are able to come into contact with a metal that conducts electricity very well or a metal with a high electrical conductivity. Particularly in the case of long and narrow gaps, the number of the H*metal contacts is increased and the recombination is promoted since the probability of contact is correspondingly increased.

On account of this particularly narrow and long gap geometry, a recombination of the hydrogen radicals is promoted in the edge region of the optical element or collector mirror before the hydrogen radicals penetrate into the layer system and, as a consequence thereof, the risk of forming blisters and the destruction of the optical element accompanying this is reduced. Moreover, the protective cover 130 according to the disclosure also achieves mechanical protection of the edge region of the optical element against scratches and radiation protection in relation to the electromagnetic (e.g. EUV) radiation by shadowing.

Figure 2:
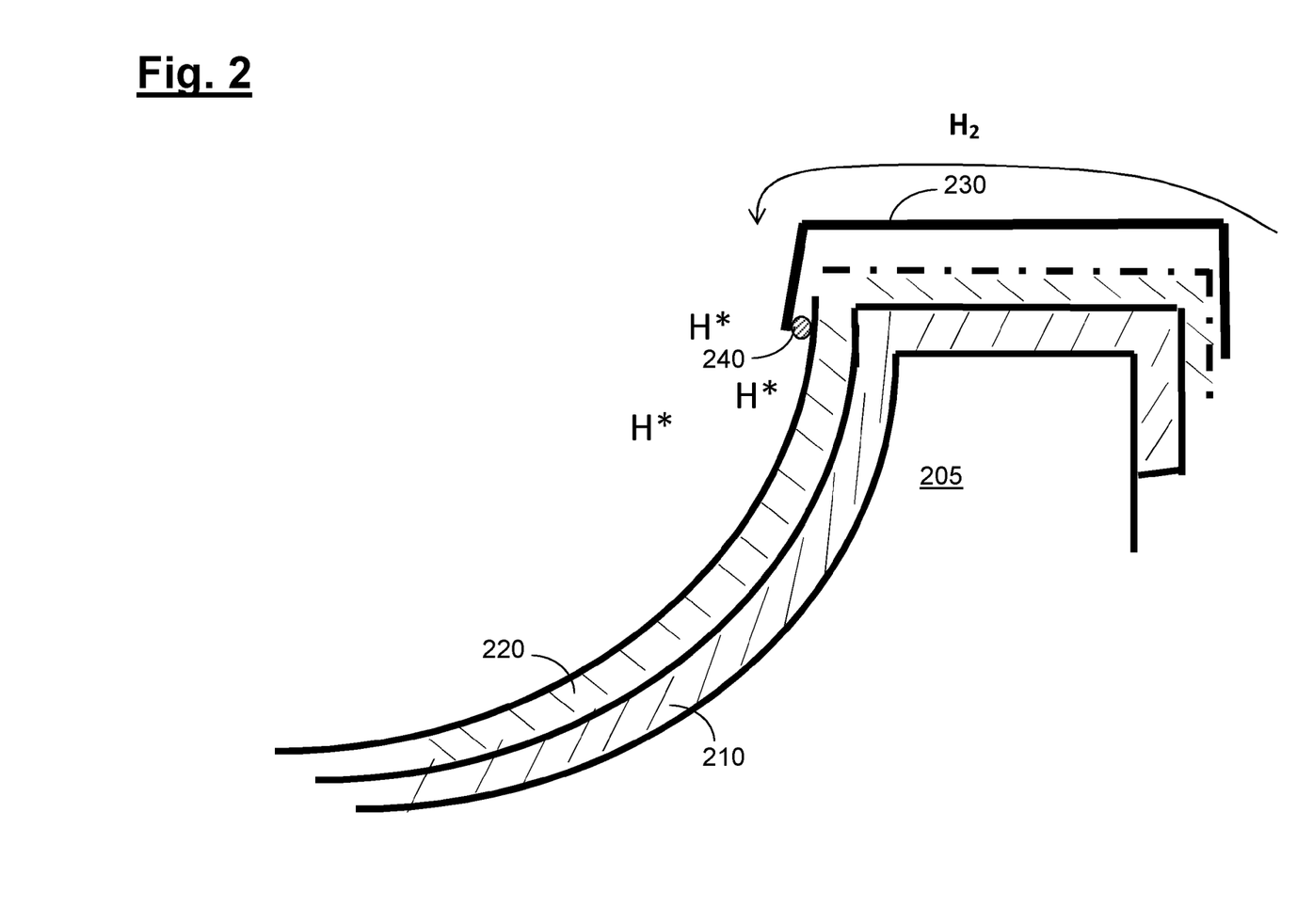
Figure 3:
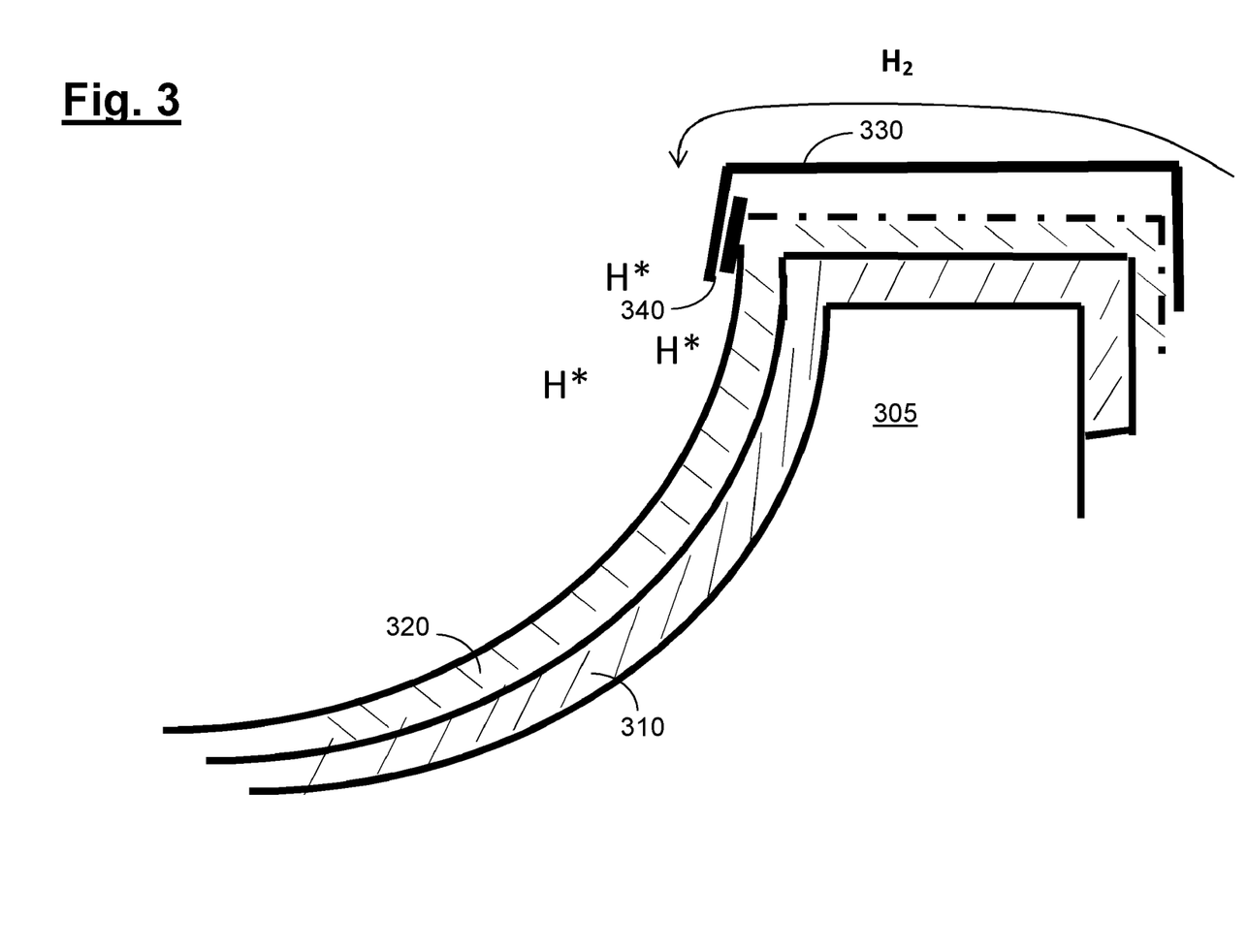

FIG. 2 and FIG. 3 show schematic illustrations of further possible embodiments of the disclosure, wherein components which are analogous to, or substantially have the same function as, those in FIG. 1 are denoted by reference signs that are increased by "100" and "200", respectively.

In these embodiments, the gap described above in each case has a seal 240 and 340, respectively, in its radially interior portion that faces the optical effective surface. As indicated in FIG. 2 and FIG. 3, this seal 240 and 340, respectively, may have a different geometry and it is preferably produced from a material which does not exhibit any contamination or outgassing effects, particularly under the influence of the hydrogen radicals and EUV radiation. In embodiments, a metal mesh or a stack of appropriate metal films, in particular, may serve as a seal, as a result of which an increased recombination surface is provided for the hydrogen radicals. In further embodiments, the relevant seal 240 and 340, respectively, can also be configured as a carrier or adhesive layer which may be coated with a comparatively soft metal such as e.g. sheet gold for avoiding damage through scratches. It is also possible to use a soft base material, e.g. in the form of indium (In), polyethylene (PE), polyimide (PI) films or Viton, in order to avoid damage through scratches.

Figure 4:
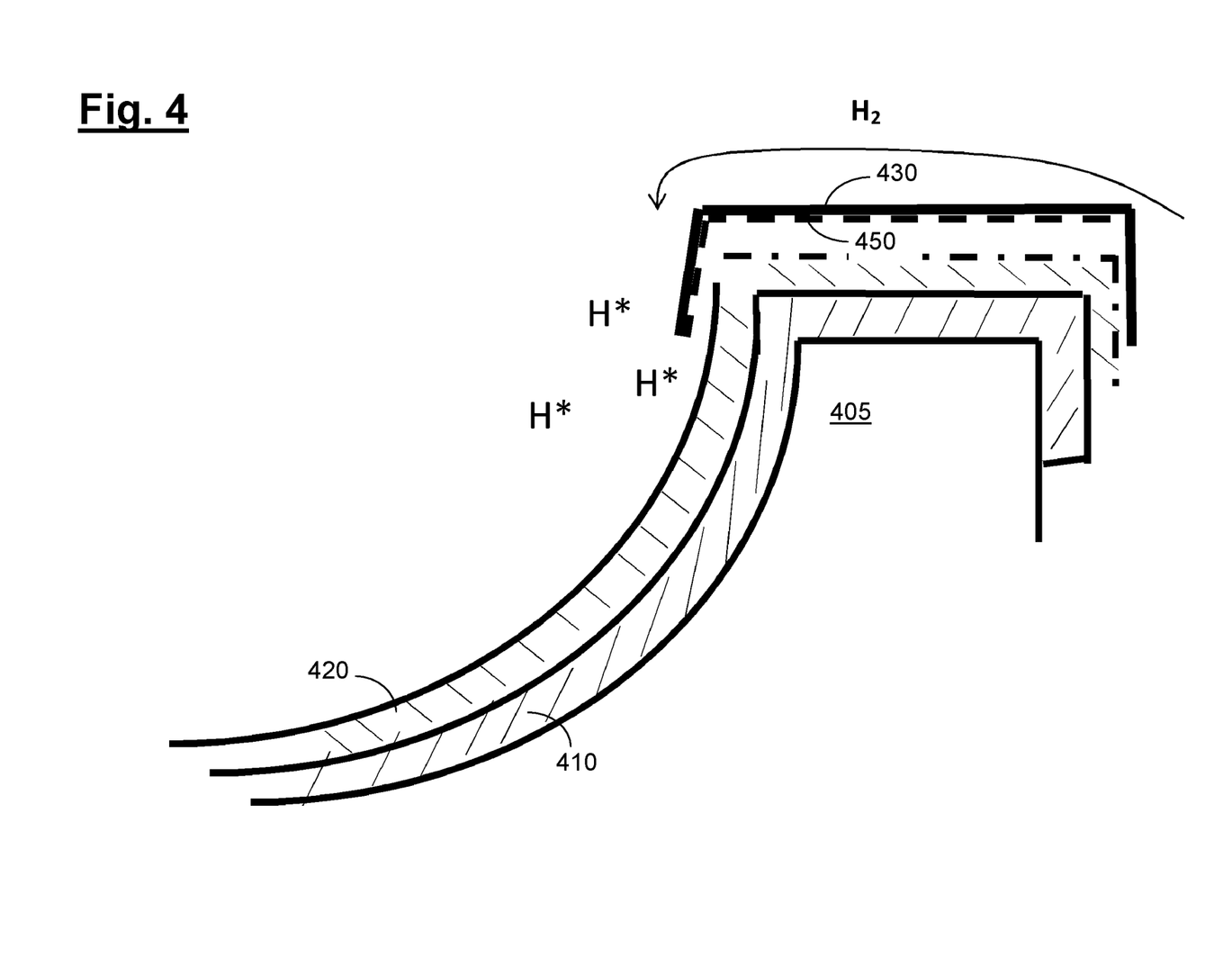
Figure 5:
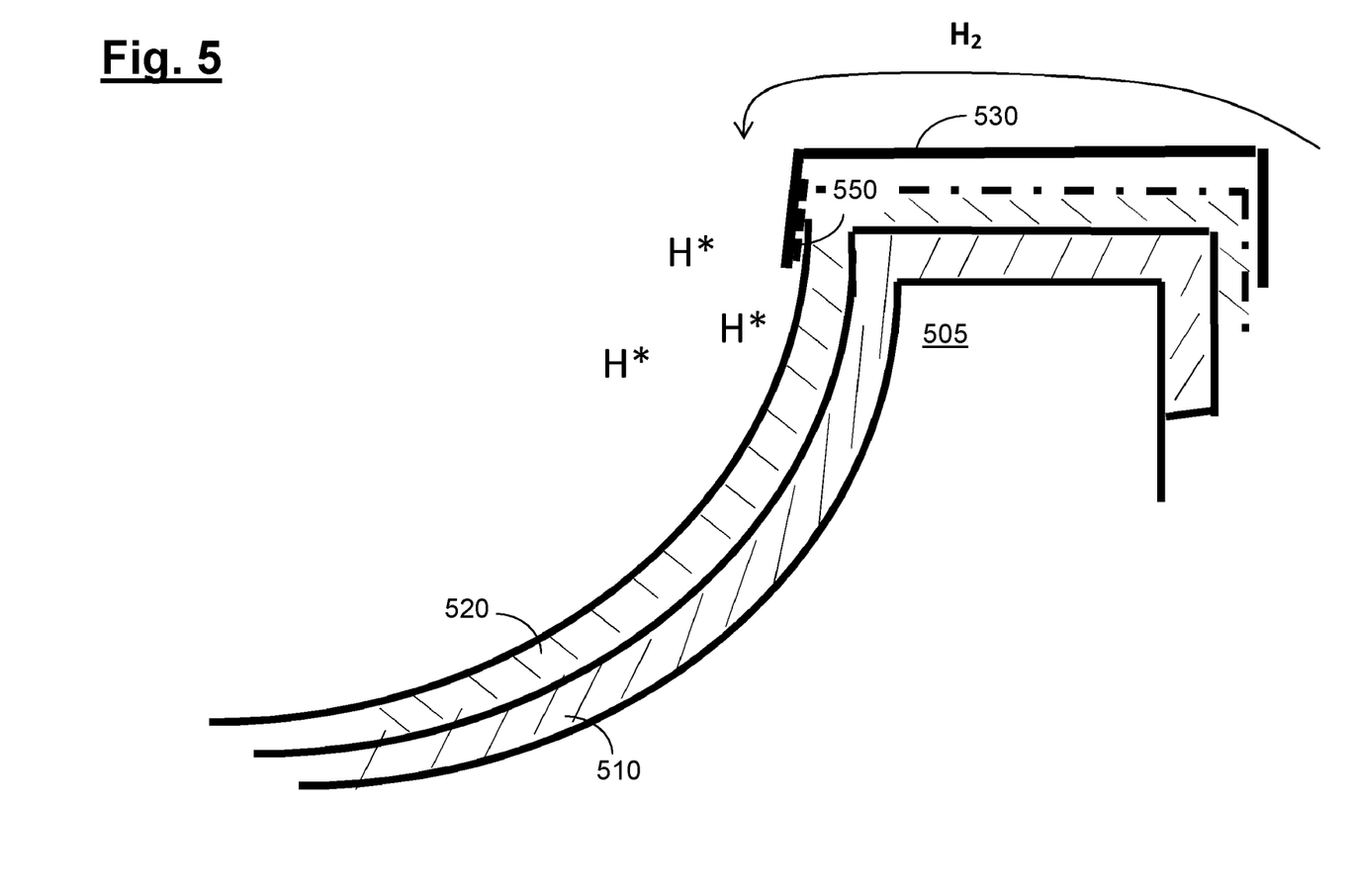

FIG. 4 and FIG. 5 show further embodiments of the disclosure, wherein components which are analogous to, or substantially have the same function as, those in FIG. 1 are denoted by reference signs that are increased by "300" and "400", respectively.

What is common to these embodiments is that, on its surface that faces the edge region of the optical element or collector mirror, the protective cover 430 and 530, respectively, has a coating 450 and 550, respectively, made of a material that assists the recombination of hydrogen radicals to form molecular hydrogen. Alternatively, instead of a coating, use can also be made of a or an inlay made of the appropriate materials. By way of example, this material can be copper (Cu), silver (Ag), gold (Au), nickel (Ni), cobalt (Co), chromium (Cr) or vanadium (V). As a consequence, a reactive wall made of suitable material is provided in these embodiments in each case, the reactive wall assisting the recombination of the hydrogen radicals, as a result of which the risk of an ingress of hydrogen radicals into the layer system via the reflection layer stack 420 and 520, respectively, is significantly reduced.

While the coating 450 extends over the entire surface of the protective cover 430 that faces the layer system or the reflection layer stack 420 in the exemplary embodiment of FIG. 4 and—analogously to the exemplary embodiment of FIG. 1 in this respect—a finite gap spacing is present between the protective cover 430 and the layer system or reflection layer stack 420, the coating 550 according to the exemplary embodiment of FIG. 5 is only provided in a radially interior portion of the protective cover 530, with the coating lying directly on the layer system or reflection layer stack 520 and closing the relevant gap. As a consequence of configuring the coating to be made from a comparatively soft material (such as e.g. copper), damage to the reflection layer stack 520 by scratches is simultaneously avoided here.

In further embodiments, the protective cover according to the disclosure may also be produced globally from one of the above-described, hydrogen-recombination-promoting materials (such as e.g. copper), wherein, in this case, a coating that does not assist the recombination of the hydrogen radicals is provided on the (sur)face of this protective cover facing away from the layer system or reflection layer stack in order to continue to facilitate a supply of hydrogen gas into the region to be cleaned of the optical effective surface of the optical element.

Even though the disclosure has been described on the basis of specific embodiments, numerous variations and alternative embodiments are apparent to a person skilled in the art, for example by combination and/or exchange of features of individual embodiments. Accordingly, it goes without saying for a person skilled in the art that such variations and alternative embodiments are concomitantly encompassed by the present disclosure, and the scope of the disclosure is restricted only within the meaning of the accompanying patent claims and the equivalents thereof.

What is claimed is:

1. An optical element, comprising:
   an optical effective surface, comprising:
      a substrate;
      a layer system supported by the substrate; and
      a protective cover configured to inhibit ingress of hydrogen radicals into the layer system,
   wherein:
      the protective cover extends over an edge region of the optical element;
      the edge region is adjacent to the optical effective surface; and
      the protective cover comprises a material configured to assist recombination of hydrogen radicals to form molecular hydrogen.

2. The optical element of claim 1, wherein:
   the protective cover has a surface facing the edge region;
   the surface of the protective layer facing the edge region comprises at least one member selected from the group consisting of a coating and an inlay; and
   the at least one member comprises the material configured to assist recombination of hydrogen radicals to form molecular hydrogen.

3. The optical element of claim 1, wherein the material configured to assist recombination of hydrogen radicals to form molecular hydrogen that assists is selected from the group consisting of copper, silver, gold, nickel, cobalt, chromium and vanadium.

4. An optical element, comprising:
   an optical effective surface, comprising:
      a substrate;
      a layer system supported by the substrate; and
      a protective cover configured to inhibit ingress of hydrogen radicals into the layer system,
   wherein:
      the protective cover extends over an edge region of the optical element
      the edge region is adjacent to the optical effective surface;
      the protective cover comprises a material configured to assist recombination of hydrogen radicals to form molecular hydrogen; and
      a gap is present between the protective cover and the layer system, and
   wherein at least one of the following holds:
      i) the gap has a mean gap thickness and a gap length, and a ratio of the gap thickness to the gap length is less than 0.8;
      ii) the gap has a mean gap thickness of less than 0.6 mm;
      iii) the optical element further comprises comprising a seal in a radially interior portion of the gap, wherein the radially interior portion of the gap faces the optical effective surface.

5. The optical element of claim 4, wherein:
   the gap has a mean gap thickness and a gap length; and
   a ratio of the gap thickness to the gap length is less than 0.8.

6. The optical element of claim 4, wherein the gap has a mean gap thickness of less than 0.6 mm.

7. The optical element of claim 4, wherein the gap has a gap length of at least 4 mm.

8. The optical element of claim 4, further comprising a seal in a radially interior portion of the gap, wherein the radially interior portion of the gap faces the optical effective surface.

9. The optical element of claim 8, wherein the seal comprises at least one member selected from the group consisting of a mesh and a film stack.

10. The optical element of claim 8, wherein the seal comprises at least one member selected from the group consisting of a scratch-avoiding coating and a scratch-avoiding in-lay.

11. The optical element of claim 1, wherein, at least in regions, the protective cover directly contacts the layer system.

12. The optical element of claim 1, the optical element comprises a mirror.

13. The optical element of claim 1, the optical element comprises a collector mirror.

14. The optical element of claim 1, wherein the optical element is configured for a working wavelength of less than 30 nm.

15. An optical system, comprising:
an optical element according to claim 1,
wherein the optical system is a microlithographic optical system.

16. The optical system of claim 15, wherein the optical system is a plasma light source.

17. An apparatus, comprising:
an illumination device; and
a projection lens comprising an optical element according to claim 1,
wherein:
the illumination device is configured to illuminate a mask in an object plane of the projection lens;
the projection lens is to image structures of the mask onto an image plane of the projection lens; and
the apparatus is a microlithographic projection exposure apparatus.

18. An optical element, comprising:
an optical effective surface, comprising:
a substrate;
a layer system supported by the substrate; and
a protective cover configured to inhibit ingress of hydrogen radicals into the layer system,
wherein:
the protective cover extends over an edge region of the optical element;
the edge region is adjacent to the optical effective surface; and
the protective cover comprises a material comprising at least one member selected from the group consisting of copper, silver, gold, nickel, cobalt, chromium and vanadium.

19. The optical element of claim 18, wherein:
the protective layer has a surface facing the edge region;
the surface of the protective layer facing the edge region comprises at least one member selected from the group consisting of a coating and an inlay; and
the at least one member comprises the material configured to assist recombination of hydrogen radicals to form molecular hydrogen.

20. The optical element of claim 18, wherein a gap is present between the protective cover and the layer system.

* * * * *

UNITED STATES PATENT AND TRADEMARK OFFICE
CERTIFICATE OF CORRECTION

PATENT NO. : 10,578,974 B2
APPLICATION NO. : 16/447001
DATED : March 3, 2020
INVENTOR(S) : Ralf Moser et al.

Page 1 of 1

It is certified that error appears in the above-identified patent and that said Letters Patent is hereby corrected as shown below:

In the Claims

Column 8, Line 31, Claim 4, after "element" insert -- ; --.

Signed and Sealed this
Fifth Day of May, 2020

Andrei Iancu
*Director of the United States Patent and Trademark Office*